United States Patent [19]

Gonda

[11] 4,086,108
[45] Apr. 25, 1978

[54] SELECTIVE DOPING CRYSTAL GROWTH METHOD

[75] Inventor: Shunichi Gonda, Higashi-Murayama, Japan

[73] Assignee: Agency of Industrial Science & Technology, Tokyo, Japan

[21] Appl. No.: 781,889

[22] Filed: Mar. 28, 1977

[30] Foreign Application Priority Data

Jun. 24, 1976 Japan ............................... 51-73868

[51] Int. Cl.² ................... H01L 21/203; H01L 21/363
[52] U.S. Cl. .................................... 148/175; 148/1.5; 357/91; 357/20; 156/605
[58] Field of Search ..................... 427/43, 35; 156/605, 156/606, 610; 250/427; 148/1.5, 175

[56] References Cited

U.S. PATENT DOCUMENTS

| 3,472,751 | 10/1969 | King ........................... 204/192 |
| 3,520,741 | 7/1970 | Mankarious ....................... 148/175 |
| 3,551,213 | 12/1970 | Boyle ............................ 148/1.5 |
| 3,657,542 | 4/1972 | Futch, Jr. et al. ................. 250/84 |
| 3,909,308 | 9/1975 | Heagy ............................ 148/1.5 |
| 3,915,765 | 10/1975 | Cho et al. ....................... 148/175 |
| 3,928,092 | 12/1975 | Ballamy et al. ................... 148/175 |
| 3,941,624 | 3/1976 | Cho .............................. 148/175 |

OTHER PUBLICATIONS

G. Dearnaley et al. (Editors), Ion Implantation, North-Holland, London, 1973, pp. 311-317.
J. W. Mayers et al., "Zn and Te Implantations into GaAs., Jour.", Appl. Phys. 38 (1967) 1975.
M. Naganuma et al., "Ionized Zn Doping of GaAs Molecular Beam Epitaxial Films", Appl. Phys. Lett. 27 (1975) 342.

Primary Examiner—L. Dewayne Rutledge
Assistant Examiner—Upendra Roy
Attorney, Agent, or Firm—Kurt Kelman

[57] ABSTRACT

Molecular beams of elements constituting a crystal and ion beams prepared by ionizing dopant atoms and/or dopant molecules are simultaneously and uniformly directed to a surface of a substrate and a region of the surface which is not required to be doped is simultaneously irradiated with electron beams. The ion beams directed to the regions not to be doped are coupled with the electron beam prior to and on arrival at the region and electrically neutralized. Thus, the crystal grows in some regions without the dopant and the crystal also grows in other regions with the dopant.

2 Claims, 3 Drawing Figures

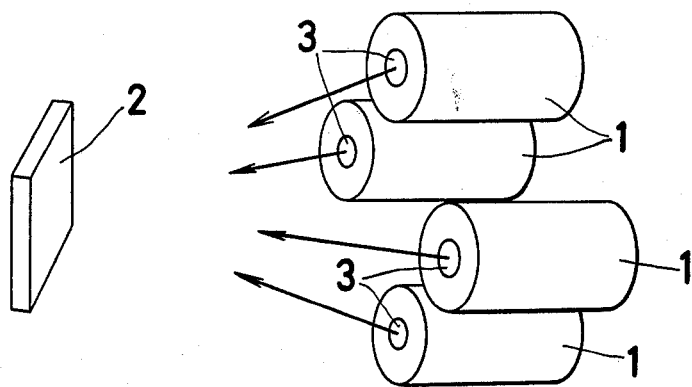
Fig_1 PRIOR ART
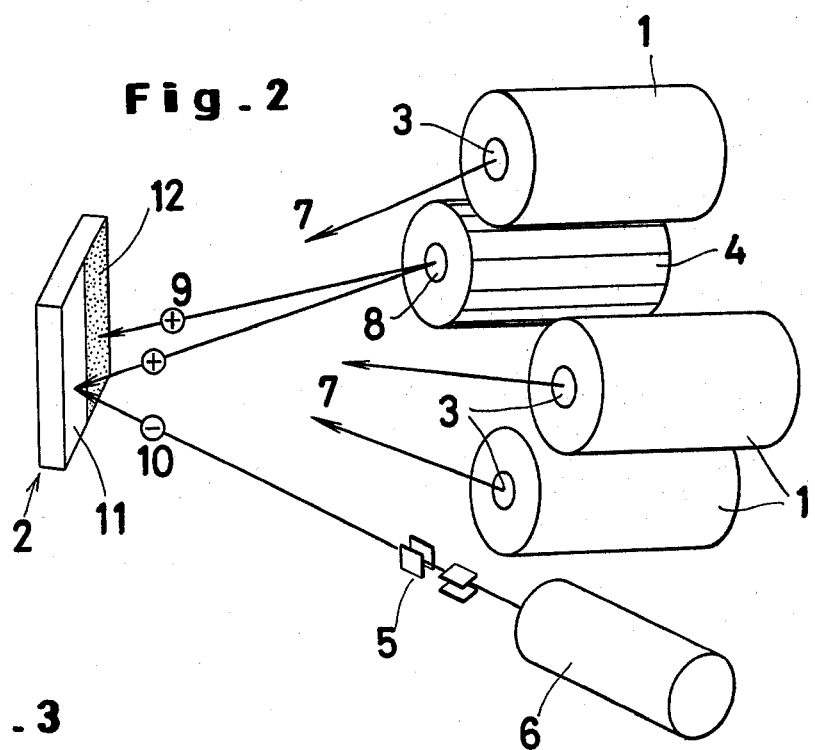
Fig_2
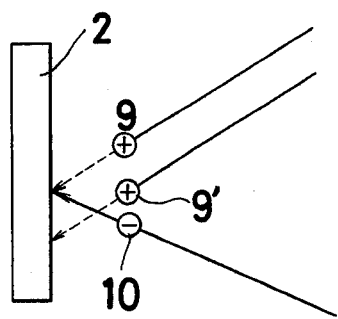
Fig_3

SELECTIVE DOPING CRYSTAL GROWTH METHOD

BACKGROUND OF THE INVENTION

The present invention relates to a selective doping crystal growth method by which specific dopant atoms and/or specific molecules are introduced selectively into a desired region in growing a crystal by using molecular beams consisting of constituent elements and ion beams consisting of the dopant.

As the method for introducing specific atoms into a desired region of a crystal with, for example, the purpose of selectively doping the crystal with impurity atoms, it has been usual to provide a mask of photoresist or metallic thin film on a surface of the crystal and to introduce the specific atoms by diffusion or ion implantation. In this method, however, the atoms are forced into the already grown crystal and thus it is not a method for introducing the specific atoms selectively into a desired region of a crystal during growth.

Therefore, in the above method there is a limitation on the doping depth of the atoms from the surface of the specimen and, according to this method, it is very difficult to obtain a crystal having a complicated doping profile which may, for example, be produced by forming a layer selectively including atoms with a pattern on another layer selectively including other atoms with another pattern.

In most of the conventional methods, a heat treatment is required which does not always favorably affect the crystalline quality thereof.

Further, a method of growing crystal with selective doping has been known in which the fact that ions have electric charges is utilized and the traveling directions of ions are controlled by using deflection electrodes so that portions of a substrate where the doping is required are irradiated with ions. This method is capable of selective doping during crystal growth to some extent. However, the method is not effective since it is difficult to accurately inject the substrate with heavy ions over a relatively wide area and in a desired pattern.

Further, in order to achieve the selective growth of crystal, a mask must be disposed in front of the substrate surface to selectively block ion beams, and thus there is a possibility of blocking molecular beams of constituent elements, making the crystal growth impossible.

As another conventional method, a molecular beam epitaxial method has been known in which a crystal is grown on a substrate surface by irradiating the substrate surface heated to a suitable temperature with molecular beams of constituent elements of the crystal. In this epitaxial method, the crystal is selectively grown by a suitable means such as a mask provided on the substrate surface.

SUMMARY OF THE INVENTION

The object of the present invention is to provide a selective doping crystal growth method by which during crystal growth, specific atoms and/or specific molecules which are volatile and have low sticking coefficients are introduced exactly and easily into a desired region three-dimensionally by ionization and neutralization.

In order to achieve the above object, the selective doping crystal growth method according to the present invention comprises the steps of irradiating a surface of a substrate with molecular beams consisting of constituent elements of the crystal and ion beams consisting of doping atoms and/or doping molecules simultaneously and uniformly and irradiating a desired region of the surface which is not required to be doped with electron beams, whereby the ion beams irradiating the desired region are electrically neutralized by the electron beam, so that because of their low sticking coefficient the doping molecules constituting the ion beam are blocked from sticking in the surface while the crystal continues to grow, and, on the other hand, the crystal doped with the molecules and/or atoms constituting the ion beams grow on the region which is not irradiated with the electron beams. Since it is easy to control the direction of the electron beams by using deflection electrodes, the doping in the present invention can be exactly performed selectively. Since selective doping is made during crystal growth according to the present invention, it is possible to easily obtain a crystal having an arbitrary three-dimensional structure by changing the irradiating direction of the electron beams and/or changing the densities of the dopant and/or the constituent elements of the crystal, during crystal growth.

Other objects and features of the present invention will become apparent from the following description of preferred embodiments of the present invention with reference to the accompanying drawings.

BRIEF DESCRIPTION OF THE DRAWING

FIG. 1 is an explanatory illustration of the principle of the conventional molecular beam epitaxial method;

FIG. 2 is an explanatory illustration of the principle of the selective doping crystal growth method according to the present invention; and FIG. 3 is an explanatory illustration showing the coupling condition of the ion beam and the electron beam in the present method.

DESCRIPTION OF THE PREFERRED EMBODIMENTS

FIG. 1 shows the conventional, molecular beam epitaxial method, in which a plurality of molecular beam effusion cells 1 and a substrate 2 heated to a suitable temperature are disposed in a high vacuum chamber maintained below $10^{-10}$ mmHg and a surface of the substrate 2 is irradiated with a plurality of molecular beams effused from a plurality of orifices 3 of the molecular beam effusion cells 1. The molecular beams stick in the surface of the substrate 2 with a finite probability and the molecules grow thereon as crystal. In the case of growing GaAs, for example, beam effusion cells containing Ga molecules and As molecules, respectively, are heated to produce molecular beams of Ga molecules and As, $As_2$ and $As_4$ molecules, etc. and the molecular beams are directed to GaAs substrate heated to a temperature around 600° C, resulting in a single crystal GaAs grown on the substrate.

In this molecular beams epitaxy, when it is desired to dope GaAs single crystal with n-type impurity, a molecular beam of such as molecular Si or Sn may be utilized. On the other hand when p-type impurity is to be used as the doping material, if the substrate is irradiated with Zn atoms as are used in liquid epitaxy in the form of a molecular beam, the Zn will hardly stick in the substrate surface and, thus, will not be captured in the crystal, because the vapor pressure of Zn atoms is high and Zn is volatile.

In fact, when $10^5$ molecules of Zn are directed onto a substrate only one of them sticks on the substrate. It has been reported that in order to capture Zn atoms in the crystal by ionizing Zn molecules and irradiating the substrate surface with ion beams, the sticking coefficient of Zn atoms on the substrate surface is increased by a few orders in comparison with the case where Zn is not ionized.

In the latter case, since the dependency of the amount of ionized Zn molecules, i.e., Zn ions captured by the crystal, on acceleration voltage is not so large, the effect, i.e., the considerable increase of the sticking coefficient may be obtained due to not the hitting of accelerated Zn ions as in ion implantation but the ionization per se.

The present invention relates to a selective doping crystal growth method, in which the crystal growth is achieved by introducing specific atoms in an arbitrary pattern by utilizing the above described principle of doping with ion beams. The present invention will be described with reference to FIG. 2.

FIG. 2 is an illustration of the selective doping crystal growth method according to the present invention. In a high vacuum chamber (not shown) maintained at a pressure below $10^{-10}$ mmHg, a plurality of molecular beam effusion cells 1, an ion beam effusion cell 4 and an electron gun 6 having a set of deflection electrodes 5 in front thereof are disposed as shown. Further a substrate 2 is also disposed in a position in the chamber defined by the directions of the molecular beam effusion cells 1, the ion beam effusion cell 4 and the electron gun 6. The molecular beam effusion cells 1 each has an orifice 3 and the peripheral surfaces of the cells are heated so that molecular beams 7 each containing constituent elements of the crystal are generated thereby, derived from the respective orifices 3 thereof and directed to the surface of the substrate 2. In the same manner, an ion beam 9 containing volatile atoms and/or volatile molecules as dopant is derived from an orifice 8 of the ion beam effusion cell 4, accelerated by applying an acceleration voltage and directed to the surface of the substrate.

On the other hand, an electron beam 10 derived from the electron gun 6 is accelerated by applying an acceleration voltage and directed to a region 11 of the substrate surface where the doping is not required. The direction of the electron beam 10 is controlled by the deflection electrodes 5. In this case, the electron beam 10 after being deflected by the deflection electrodes moves straight to the region 11 and is coupled with the ion beam 9 coming into the region 11 to electrically neutralize the ion beam 9. Accordingly, the doping atoms and/or molecules electrically neutralized in this manner cannot stick in the substrate 2. Therefore, only atoms and/or molecules effused by the molecular beam effusion cells 1 stick in the region 11 and grow as a crystal.

On the other hand, a region 12 which is not irradiated with the electron beam 10, i.e., the region which requires the doping, is irradiated with the molecular beams 7 and the ion beam 9, so that the atoms and/or molecules constituting the molecular beams 7 and the doping atoms and/or molecules constituting the ion beam 9 grow on the region 12 in the form of a crystal. Therefore, a selective doped crystal grows on the surface of the substrate 2.

The relation between the ion beam and the electron beam will be described in detail by taking Zn as an example of the doping atom to be ionized. It is assumed that growing GaAs is doped with Zn in a density of $10^{18}$ atoms/cm$^3$, the growing speed of crystal is 100 A/min. and the sticking coefficient of ionized Zn is 0.01.

In these circumstances, the number of ions to be supplied to a unit area of the substrate for a unit time will be $1.7 \times 10^{12}$/cm$^2$.sec. An acceleration voltage of 200 volts is enough for this purpose and, with this acceleration voltage, the velocity of a Zn ion just before it reaches the substrate is $8 \times 10^6$ cm/sec.

In the case of electrons, since the mass of a single Zn atom is $10^{-23}$ grams while that of an electron is $10^{-28}$ grams, if the acceleration voltage is 5 K volts, the velocity of the electron will be about $10^{10}$ cm/sec. which is higher than that of a Zn ion by three orders or more. Therefore, the ion appears to be stationary with respect to the electron and the relation of the electron having minus charge to the stationary heavy ion having positive charge is that the electron passes adjacent the ion at high speed. This phenomenon is close to the so-called Rutherford scattering. As to a case where the electron 10 passes adjacent the ion 9' toward another region as shown in FIG. 3, the influence of the existence of the ion on the traveling direction of the electron can be roughly estimated by using the general equation of Rutherford scattering. That is, where $\psi$ represents the traveling angle to be changed by the existence of the ion ($\psi$ is determined such that, when $\psi=90$, there is no change of traveling direction of electron), $\cos \psi \simeq 10^{-8}$ is established. Therefore, $\psi$ corresponds to substantially 90°, showing substantially no effect on the traveling direction of the electron.

When ions come into the vicinity of the substrate surface, electrons should also be supplied to the same space. Since the crystal growing speed in the present method is very low (about 100 A/min.) and hence the number of ions supplied can be small, it is always possible to supply excess number of electrons around the target space and, therefore, it is possible to obtain a high resolution of the border portion of the pattern on a sub-micron order.

As effective doping atoms and/or molecules to be used in the present invention, there can be mentioned, for example, GaAs substrate, Zn, Mg, $O_2$ and $N_2$. It is preferable, however, to use molecules such as a Zn molecule and an N molecule, etc. which are volatile and have a high sticking coefficient in the substrate when ionized.

In case where it is desired to grow on the substrate a crystal having a three-dimensional structure, the substrate of, for example, GaAs is heated to a temperature on the order of 550° C and Ga molecules, As molecules and molecules such as Sn molecules which serve as n-type dopant are supplied to the heated substrate in the form of molecular beams to grow an n-type GaAs on the substrate. Further a Zn ion beam is directed to the substrate such that the amount of Zn ion becomes larger than the doping amount of Sn, and an electron beam is directed to the region of the substrate where there is no need of the doping while the above crystal growth continues. When the thickness of the grown crystal reaches a desired value, the supply of n-type dopant Sn and the irradiation of the electron beams are terminated, resulting in only Zn doping on the whole surface.

As described hereinbefore, according to the present invention, it becomes possible to dope a desired wide region of a substrate with specific atoms and/or specific molecules with high precision during the crystal growth. Further since it is possible to introduce impurities under a good crystallizing condition, it is possible to control the introduced thickness of the impurities in the grown layer and there is no need of complicated processes such as the stacking processes of complicated patterns and the complicated introducing operation using masks, as even without such processes there is no adverse effect on crystallization.

Furthermore, since it is possible to vary the distribution and density of dopant in the crystal growing direction, it is possible to selectively introduce impurities with a three-dimensional variation. Therefore, the present invention is extremely effective in fabricating semiconductor devices. Further, according to the present invention, when suitable atoms are selected as constituents and dopants, it is possible to selectively change the ratio of three constituents. In addition to this, the present invention is easily practicable because it utilizes the electron beam which is easily deflected in comparison with the deflection of ion beams.

What is claimed is:

1. A selective doping crystal growth method comprising the steps of irradiating uniformly a surface of a substrate with molecular beams constituting of constituent elements of a crystal and ion beams constituting of atoms and/or molecules as dopant and simultaneously irradiating specific regions of said surface where the doping is unnecessary with electron beams to neutralize said ion beam directed to said regions with said electron beam.

2. A selective doping crystal growth method as claimed in claim 1, wherein said electron beam is deflected to irradiate said specific regions.

* * * * *